United States Patent [19]

Fraas et al.

[11] Patent Number: 5,096,505
[45] Date of Patent: Mar. 17, 1992

[54] PANEL FOR SOLAR CONCENTRATORS AND TANDEM CELL UNITS

[75] Inventors: Lewis M. Fraas, Issaquah; Nurullah Mansoori, Redmond; James E. Avery, Fall City; John M. Martin, Federal Way; John W. Yerkes, Fall City, all of Wash.

[73] Assignee: The Boeing Company, Seattle, Wash.

[21] Appl. No.: 527,061

[22] Filed: May 21, 1990

[51] Int. Cl.[5] .................... H01L 31/052; H01L 31/05
[52] U.S. Cl. .................... 136/246; 136/244; 136/249; 437/2; 357/81
[58] Field of Search ............... 136/244, 246, 249 TJ; 437/2-5; 357/81

[56] References Cited

U.S. PATENT DOCUMENTS

| 4,019,924 | 4/1977 | Kurth | 136/251 |
| 4,191,593 | 3/1980 | Cacheux | 136/259 |
| 4,746,371 | 5/1988 | McLeod et al. | 136/249 TJ |
| 4,776,893 | 10/1988 | McLeod et al. | 136/249 TJ |

OTHER PUBLICATIONS

B. Todorof, *Conference Record, 20th IEEE Photovoltaic Specialists Conference* (1988), pp. 1347–1352.
M. J. O'Neill et al., *Conference Record, 19th IEEE Photo-Voltaic Specialists Conference* (1987), pp. 479–484.

Primary Examiner—Aaron Weisstuch
Attorney, Agent, or Firm—Lisa & Associates

[57] ABSTRACT

Solar cells, particularly GaAs/GaSb tandem solar cells, are mounted on a honeycomb light weight panel in optical alignment with solar energy concentrators mounted on a front panel side. The cells are mounted on metallized surfaces of the heat spreader that is attached to a panel wall rear panel side. A circuit carrier has conductors which are bonded to metallization islands that are on one side only of the heat spreader. The circuit carrier is adhered to the rear panel side.

37 Claims, 6 Drawing Sheets

PANEL FOR SOLAR CONCENTRATORS AND TANDEM CELL UNITS

The present invention relates to solar cells and more particularly to the manufacture of backplane panels for concentrated sunlight arrays using solar cell strings formed by circuit carriers that are adapted for satellite or space use.

REFERENCE TO RELATED APPLICATIONS

The invention claimed herein is related to inventions disclosed in commonly owned co-pending applications of Girard et al, U.S. application Ser. No. 339,311, filed Apr. 17, 1989, now abandoned; Fraas et al, U.S. application Ser. No. 07/523,710, filed May 14, 1990; Fraas et al, U.S. application Ser. No. 07/527,038 filed on even date herewith; Kim et al, U.S. application Ser. No. 07/230,402, filed Aug. 9, 1988, now abandoned; and Kim et al, U.S. application Ser. No. 07/389,728 now U.S. Pat. No. 5,021,099.

BACKGROUND

Different types of solar cells and methods of manufacturing satellite backplane solar cell panels or arrays are known in the industry. Once the solar cells have been produced, it is necessary to have the cells mounted. It has been a continual objective in the art to optimize the electrical power output and to minimize weight of the solar cell array for satellite and space applications.

One method used to improve the operation of individual solar cells is to utilize some form of collector to focus light from a larger area down to the area of the cell using a Fresnel lens, flat or dome shaped, or the cassegrainian light concentrator concept. Another method that has been demonstrated to improve the output of the solar array is to use tandem solar cells of different semiconductive materials such as GaAs and GaSb as described in a co-pending U.S. application Ser. No. 07/523,710, filed May 14, 1990.

One problem unique to tandem solar cells is the interconnecting of the tandem cells to obtain the voltage match in a manner which can be accomplished on a cost effective basis in a larger scale manufacturing process. The McLeod et al, U.S. Pat. No. 4,776,893 discloses a tandem stacked GaAs/GaSb cell unit that is not economic to fabricate. Interconnections between the upper and lower cells, the interconnection between adjacent cell units, and the mounting of the cell units in optical alignment with solar collection lenses in a manner that facilitates dissipation of heat that is associated with the operation of each of the GaAs and GaSb cells are inadequate for many applications.

For space applications which are particularly addressed with the panel of the present invention, the elements must be able to withstand the harsh conditions of space. The panel must be able to withstand large temperature changes, large thermal gradients, intense radiation, and, at least for low earth orbit (LEO), atomic oxygen attack. The panel of the present invention provides durable panels for reliable power generation.

SUMMARY OF INVENTION

A major feature of the present invention resides in the provision of a light-weight backplane panel which will house both a large number of solar or radiant energy collectors and a corresponding number of electrically connected tandem solar cell units. Preferably, a solid block of light-weight metal is formed with recesses, cells, or compartments having thin, rigid walls to support the radiant energy collector and a string of photocell units at focal points with each compartment having a corresponding lens and photocell unit. The novel panels serve as a structure for a collector to focus light from a larger area down to a smaller area based on the size of the photoactive area of the tandem photovoltaic cell.

A further feature of this invention is to provide a novel heat spreader plate for dissipating the heat generated by each tandem solar cell unit by means of a flat plate of a suitable material that is sandwiched between the upper and lower cells of the tandem unit. Preferably, a clear flat plate of sapphire or apertured plate of AlN is thermally connected to each cell and to the panel. Metallization is provided on the plate surfaces to provide electrical connections to the two cells and to provide four terminals for connection to external circuitry.

Another feature resides in the provision of a novel circuit carrier that has strips of conductive material exposed for connection to the four terminals on the heat spreader plate which may be formed as a two dimensional panel that is adhered to the backplane panel as a cost effective and light-weight method of interconnecting tandem solar cells.

These and other features of the invention will become more fully apparent from the claims, and from the description as it proceeds in conjunction with appended drawings.

DETAILED DESCRIPTION OF PREFERRED EMBODIMENTS

Figure 1:
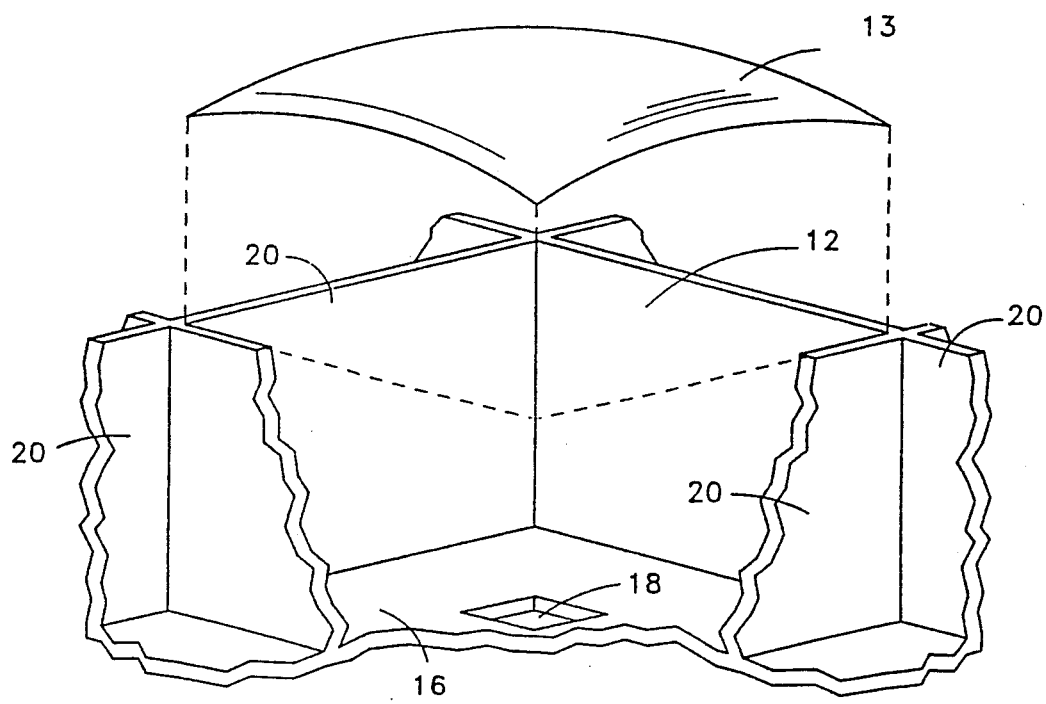
FIG. 1 is a diagrammatic, exploded view in pictorial form showing a single lens associated with a compartment having side and bottom walls broken away to show an opening against which the tandem solar cell unit is mounted.
Figure 1:
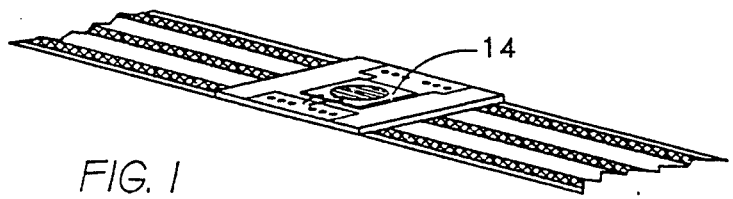
Figure 2:
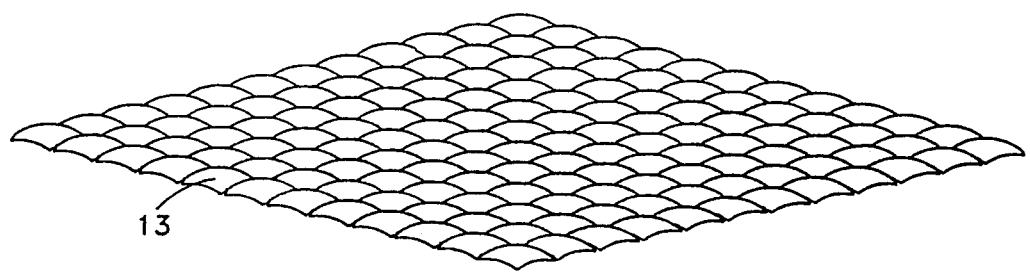
FIG. 2 is an exploded view showing an array of lenses and compartments of the type shown in FIG. 1 as they appear before being secured together.
Figure 2:
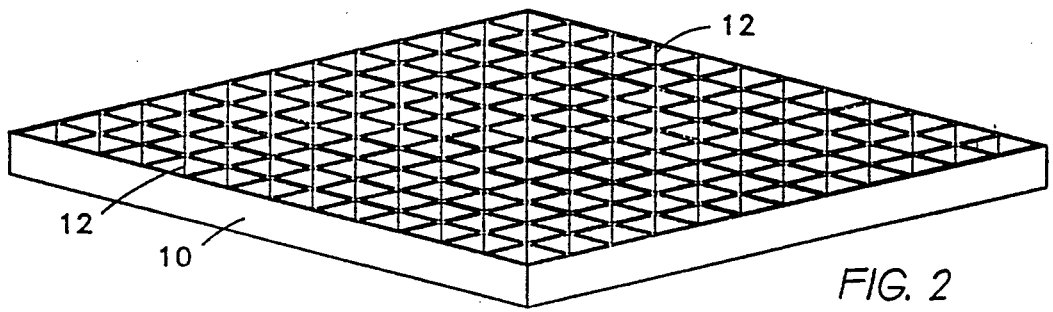

Referring to FIGS. 1 and 2, a panel 10, that may serve as a module for use in an even larger array, is illustrated to have twelve rows of compartments 12 with twelve compartments in each row. An array of lenses 13 or equivalent type of concentrator overlies the panel 10. Each of the lenses 13 collects solar energy or light from a large area and concentrates the light into a small area related to the size of the active area of a photocell 14. Photocell 14 is positioned at the backplane of the panel 10 and beneath the lower compartment surface 16 as illustrated in FIG. 1.

An opening 18 is located at the backplane where the focal point or small area of concentrated light from one of the lenses 13 is directed to allow the highly intense area of focused light to contact the active area of the photocell 14 but not any other part of the electrical wiring or members which can be damaged by exposure to intense radiation.

The upstanding walls 20 of panel 10 must be rigid to maintain a precise alignment between aperture 18 and the focal point of its respective lens 13. The thickness of all walls, including lower surface 16 must be made as thin as practicable since launch weight is a matter of major importance for space applications. The height of the walls 20 of the compartment 12 is determined by the optics of the radiant energy concentrators 13. The lens size may range between about 3 inches square to 9 inches or more and the active areas of the preferred GaAs/GaSb solar cells may range from 4 to 10 square mm. These parameters suggest an optimum wall height for compartments 12 and a thickness dimension for the block of suitable lightweight material such as aluminum.

To form the panel 10 as shown in FIG. 2, a slab of metal that may be three feet or more on each side is provided and a small hole drilled through the optical axis of each compartment 12. Thereafter, a tape controlled milling machine may be used to cut away the unwanted metal and form each compartment 12. It has been found feasible to produce upstanding walls 20 which have a thickness as thin as 10 mils which provide the requisite rigidity to support the lens array as shown in FIG. 2 with a favorable weight to size ratio. Of course, the panel can be fabricated in any other suitable way. We believe the lightest panel can be formed in this way, but other techniques can be used to focus the solar energy from individual lens elements.

The panel 10 thus consists of honeycomb construction with walls that are effective to locate, align and hold a number of light concentrating lenses of any suitable type. Each light concentrating device 13 focuses the light from a larger area to the surface of a solar cell 14 which is mounted beneath aperture 18 in the lower or backplane wall of the honeycomb panel. Generally the lenses are glass or silicone Fresnel lenses suitable for space environments.

Figure 3:
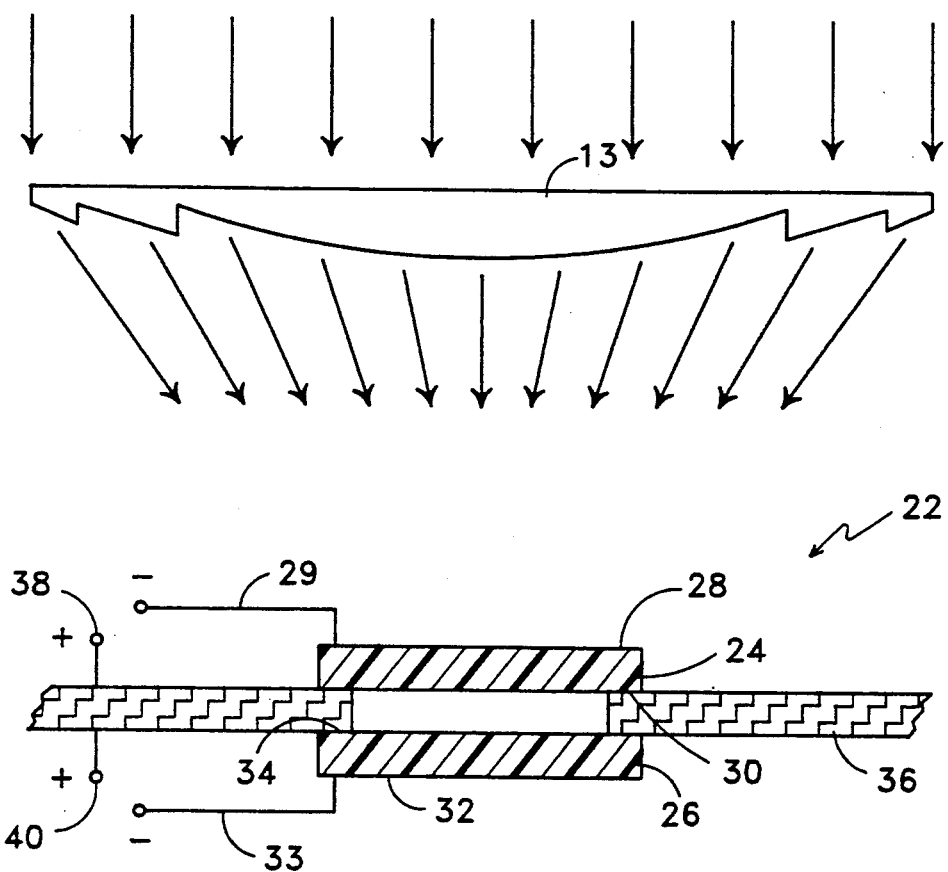
FIG. 3 is a view of a single lens and tandem photovoltaic cell in section which illustrates upper and lower cells mounted on opposite sides of a heat spreader body.

FIG. 3 diagrammatically illustrates a tandem cell 22 useful in the panel. This tandem cell 22 may comprise an upper cell 24 of GaAs semiconductive material and a lower cell 26 of GaSb semiconductive material. The upper cell 24 has an upper current carrying surface 28 connected to lead 29 and a lower current carrying surface 30. The lower cell 26 has a lower current carrying surface 32 connected to lead 33 and an upper current surface 34. The cells 24 and 26 may be fabricated by procedures disclosed in co-pending application Ser. No. 07/523,710, filed May 14, 1990, the disclosure of which is hereby incorporated by reference.

Conventional GaAs cells must be made transparent to achieve the highest conversion efficiency in a tandem or stacked call application. Several methods of forming GaAs photovoltaic cells are known in the art as explained in the McLeod et al U.S. Pat. No. 4,776,893. Further recent developments are reported in an article "Tertiary Butyl Arsine Grown GaAs Solar Cell" by Sundaram et al, *Appl. Phys. Lett.* 54 (7), Feb. 12, 1989, where growing p- and n-doped GaAs layers and p-AlGaAs layers for use as a concentrator solar cell structure is described. See also Fan et al, U.S. Pat. No. 4,547,622.

Three modifications to such GaAs cells are made when used with GaSb lower cells to optimize the conversion efficiency. First, the conventional continuous back metallization should be replaced with a gridded metallization. The back grid should use fewer grid lines than the front grid because the thicker wafer conductivity is much higher than the thinner emitter conductivity. The shading from the back grid can thereby be negligible. In small cells, the back grid may be omitted entirely.

Second, the wafer n-dopant density of the GaAs material should be reduced from $1 \times 10^{18}$ cm$^{-3}$ to about $1 \times 10^{17}$ cm$^{-3}$ to reduce free electron absorption.

Third, the anti-reflective (AR) coatings on the front and back of the GaAs cell are modified in order to provide minimal reflection across a broader bandwidth to assure passage of longer wavelength energy to which the GaSb cells are responsive.

The presently preferred transparent GaAs cell design incorporates a 450 micrometer (micron) thick n-type wafer doped to about $1 \times 10^{17}$ cm$^{-3}$ with complete photovoltaic epitaxial structure grown on it including an AlGaAs window layer. A three layer AR coating on the front surface in addition to the AlGaAs window layer serves as the front side AR coating and a two layer AR coating has also been applied to the back side in some embodiments. Important design parameters include the thickness and refractive index of each layer including the AlGaAs which functions not only as an electronic heteroface but also as one of the front AR layers. This multi-layer optical system produces a very broadband reflectance minimization through the visible energy range on out beyond the GaSb band edge at 1700 nm.

Figure 4:
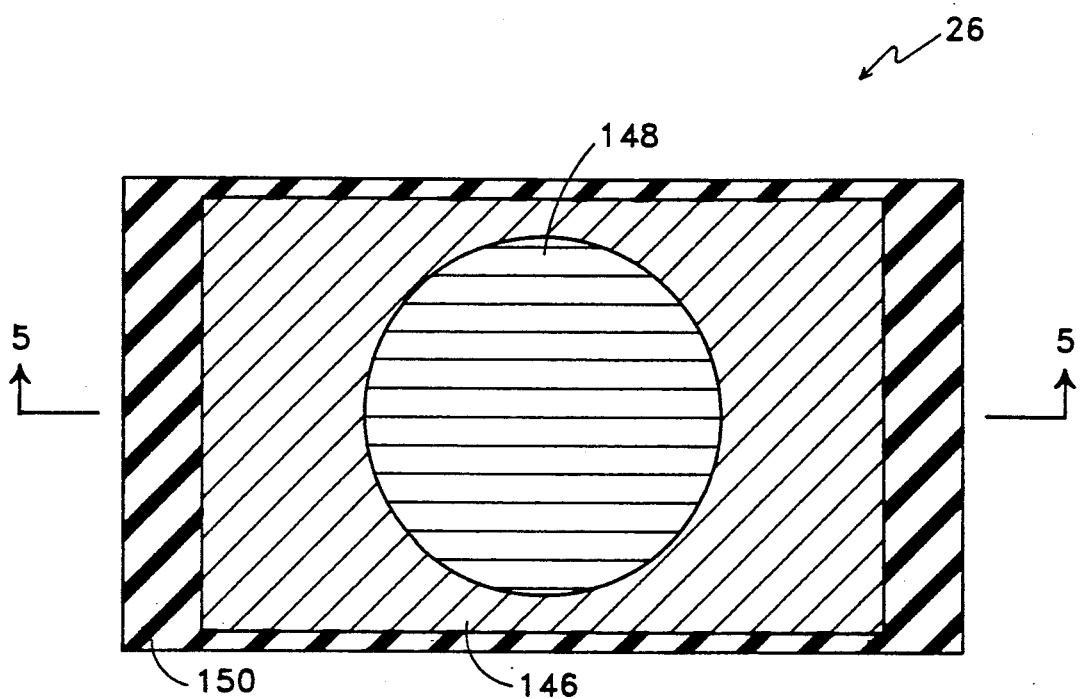
FIG. 4 is a plan view to an enlarged scale of a GaSb photovoltaic cell.
Figure 5:
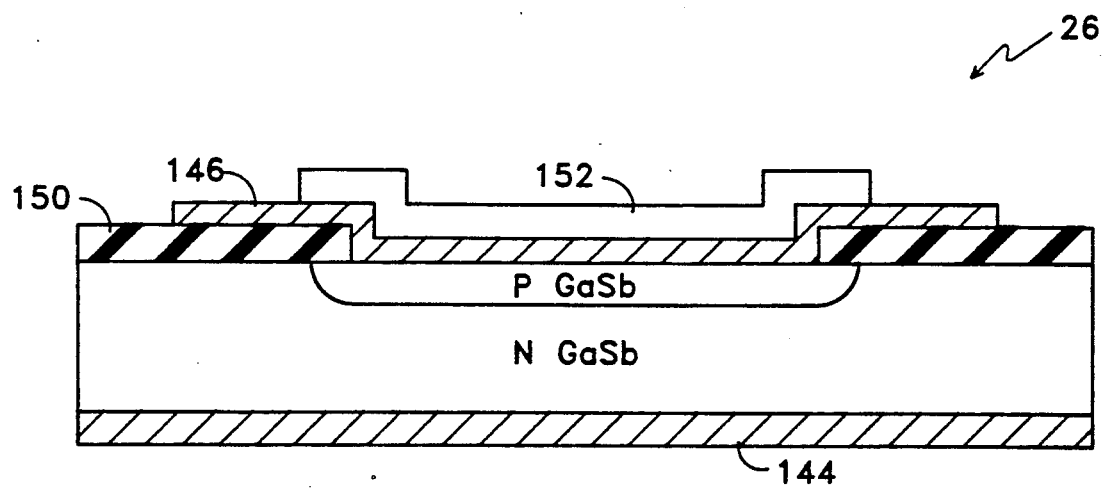
FIG. 5 is an elevation in section taken along lines 12—12 of FIG. 11.

The n-type GaSb cell is preferably a zinc-diffused cell. FIGS. 4 and 5 diagrammatically illustrate the lower cell.

The cell, shown in FIG. 5, has a metallized base 144 which may be connected to one output terminal. The bus conductor layer 146 is an upper metallized surface which may be connected to a second output terminal. Two important aspects are that only the grid lines 148 are in contact with the semiconductor at the zinc diffused region designated P GaSb in FIG. 5 and the bus conductor layer 146 must be isolated from the GaSb semiconductor substrate. Because the process is essentially planar, the front side metallization is on an insulation mask 150 of an insulative material such as silicon nitride. An anti-reflective coating 152 is important in achieving efficient energy conversion but is not essential to operability of the solar cell.

The process for fabrication of the GaSb booster cell is generally applicable to III-V diffused junction photovoltaic cells. The reference to the specific gallium antimonide material is therefore to be construed as illustrative and not limiting. The process will be described with reference to FIGS. 6A-6E.

Preferably, n-type GaSb semiconductor material is a single crystal. The use of an n-type substrate with a room temperature carrier concentration of approximately $10^{17}$ atoms/cm$^3$ is preferred and results in good device performance without a surface passivation layer. At lower doping levels, the surface of the n-type GaSb converts to p-type to an extent that degrades device performance. At higher doping levels, excessive tunneling through a junction degrades device performance. In one embodiment, the GaSb wafer may be doped with Te to $4 \times 10^{17}$/cm$^3$. Zinc is a preferred dopant material.

The insulating layer 162 (FIG. 6A) is formed as a coating on the upper surface of the GaSb substrate 161. Insulative layer 162 is preferably a two-layer coating of silicon nitride/silicon oxynitride. This two-layer system has been discovered to be effective for use on GaSb photocells. The first layer comprising silicon nitride is utilized to minimize any oxygen contact with the GaSb substrate 161. The second layer comprising silicon oxynitride is much more stable and holds up to the high temperature excursion of a subsequent diffusion step. The two-layer insulating layer may be deposited using plasma chemical vapor deposition. The first layer of silicon nitride may be about 0.01 microns thick and the second layer of silicon oxynitride approximately 0.1 microns to perform effectively. Insulating layer 162 may also be applied by sputtering.

Insulating layer 162 is next treated to form an opening exposing a portion of GaSb substrate 161 as by using standard photolithography techniques. Thus, a layer of photoresist may be deposited in a patterned form on the insulating layer 162. Thereafter the photoresist is developed to remove the insulating layer 162 at the opening where P GaSb region is formed. A p-type dopant material, such as zinc, is then diffused into the exposed surface of GaSb substrate 161 to serve as a conductivity type modifier and form a p/n junction and p-type emitter 164.

Figure 6A:
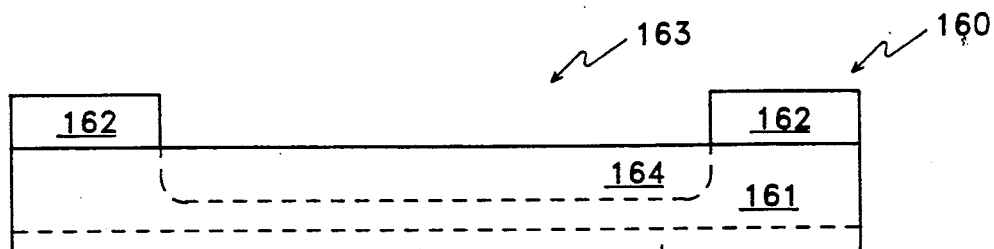
FIGS. 6A–6E are process flow diagrams outlining a preferred process for fabricating a GaSb cell.

The diffusion step may be accomplished using a quasi-closed graphite box, not shown, in a conventional manner. The box has an elemental zinc source and an elemental antimony source. The elemental Sb source is provided to build up the antimony pressure in the diffusion chamber to prevent portions of the antimony in substrate 161 from exiting substrate 161. The elemental Zn provides a source of p-type dopant atoms which diffuse through opening 163 into the lattice of substrate 161. The concentration versus depth into substrate 161 of the Zn dopant atoms is a function of time and temperature The diffusion step preferably creates an emitter doped in the mid-$10^{20}$/cm$^3$ range to a depth of approximately 0.5 micrometers (microns). During the diffusion process, an unwanted zinc diffused region 165 forms on the back side of the substrate 161 as illustrated in FIG. 6A.

Figure 6B:
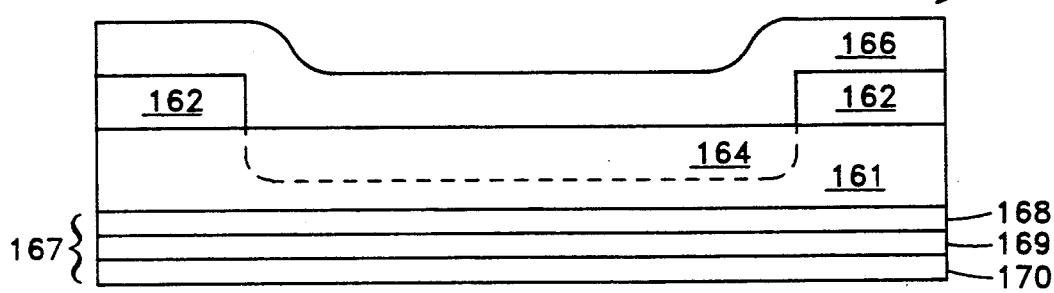
Figure 6C:
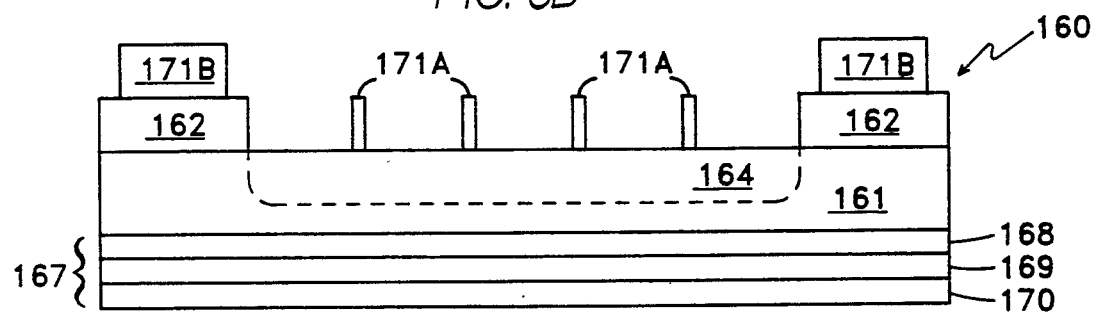

Following the diffusion step, a protective photoresist layer 166 is deposited on the surface of substrate 161 to form a patterned insulating layer 162 as shown in FIG. 6B. The back side or lower surface of substrate 161 is thereafter non-selectively etched to remove unwanted zinc that has diffused into region 165. Protective photoresist layer 166 is removed and a back side metallization contact layer 167 is formed.

Metallization contact layer 167 must have low electrical resistance, be adherent to the lower surface of substrate 161 and meet the qualifications for use in space or terrestrial applications. A typical example may comprise three layers of metal: a layer of titanium (Ti) 168, a layer of palladium (Pd) 169, and a layer of gold (Au) 170. Platinum (Pt) would also be an acceptable alternative to palladium 169. Gold 170 is used because of its good electrical properties. Palladium 169 is used as a gold diffusion barrier to make contact between titanium 168 and gold 170 and to prevent gold 170 from diffusing into titanium 168 or substrate 161, FIG. 6B. The back side metal layers may be alloyed in a furnace.

A second photolithographic step is used to form the grid pattern for a top metal 171. Top metal 171 consists of a grid portion of parallel lines 171A of conductive material and a bus portion 171B of conductive material. Top metal 171 may comprise a layer of Pt and a layer of Au. Top metal 171 is formed using standard metal liftoff techniques. In actual processing, the thickness of metal layer 171 may be approximately 0.3 microns. Only the grid lines touch the junction region. The bus pad is deposited only on the patterned insulative material and is isolated from the n-type semiconductor substrate.

Figure 6D:
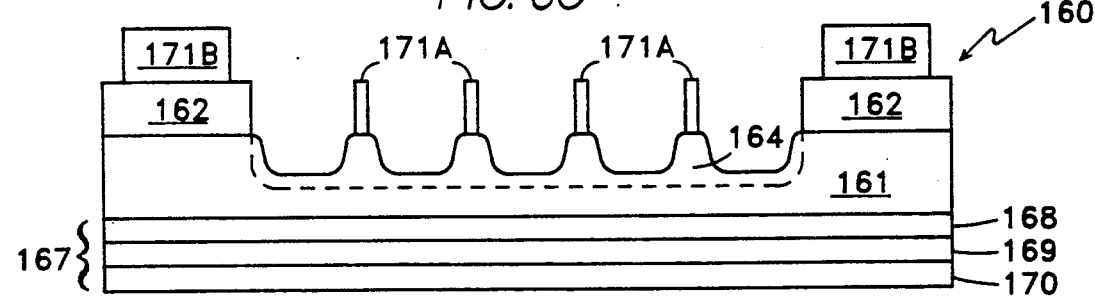

A front side etch is then performed to reduce the emitter thickness. This is illustrated in FIG. 6D but the drawing is not to scale. It should be noted that while the front side etch is not necessary, it has been found that with removal of emitter material to provide a recess between grid lines 171A beneficial results are obtained. For example, if the depth of the recess is sufficient so that the emitter material thickness is reduced from about 0.5 micrometers to about 0.1 micrometers, the device short circuit current rises by a factor of about 2.

Figure 6E:
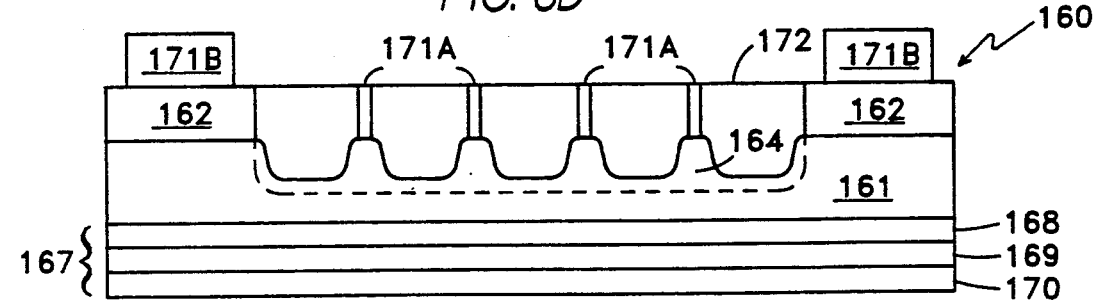

An anti-reflective coating 172 may be deposited as a coating over the emitter between the grid lines 171A as illustrated in FIG. 6E. FIG. 6E, like FIG. 6D, is diagrammatic and not to scale. Anti-reflective coating 172 may comprise a single layer or double layers and is often deposited using a vacuum deposition process as discussed in conjunction with the upper GaAs layer fabrication. It should be apparent to those skilled in the art that anti-reflective coating 172 should be tailored specifically for a spectral region of interest for booster cell. One preferred embodiment of anti-reflective coating 172 is tantalum pentoxide (Ta$_2$O$_5$) having a thickness of approximately 0.15 microns which was found to raise the short circuit current by another 1.5 times.

Referring again to FIG. 3, upper and lower cells 24 and 26 are mounted on opposite sides of a heat spreader body 36 formed as a plate from a thermally conductive material which is electrically non-conductive such as AlN or sapphire. The opposite surfaces are metallized to provide an electrical circuit contact with the upper cell lower surface 30 and the lower cell upper surface 34. Metallization is connected to terminals 38 and 40 respectively. The upper surface of the heat spreader body 36 may be mounted in a thermally conductive relation to the underside of the lower wall surface 16 of compartment 12 that is remote from the lens 13.

Figure 7:
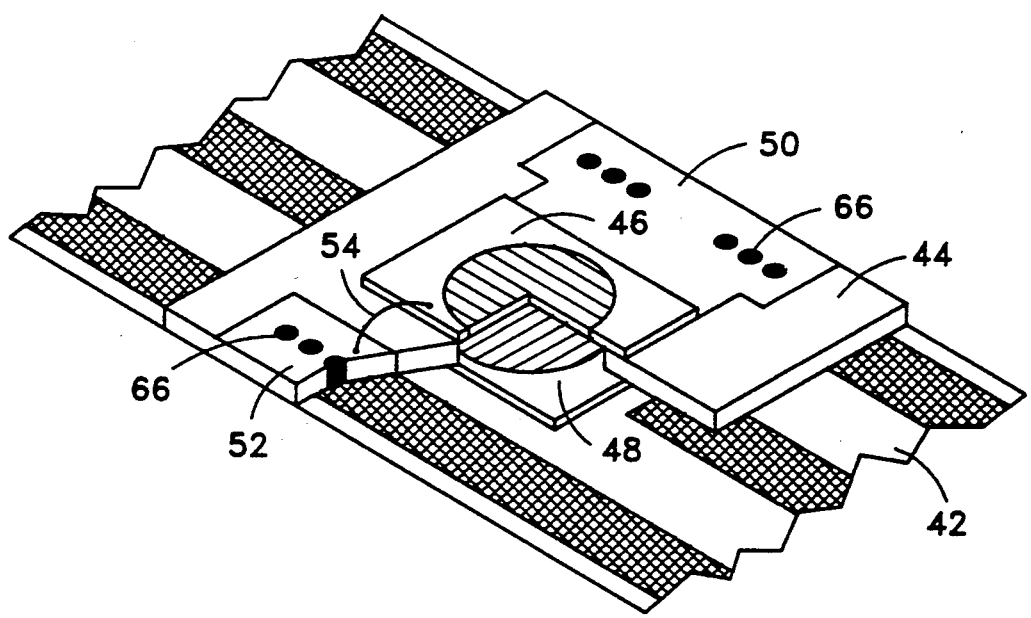
FIG. 7 is a pictorial cutaway view to an enlarged scale of a second embodiment of tandem photocell.

A second embodiment of the concentrated sunlight, mechanically-stacked GaAs/GaSb photovoltaic cell unit is illustrated in FIG. 7 which shows also a circuit carrier 42 that may be used to connect adjacent cells in a row.

In the FIG. 7 embodiment the heat spreader plate 44, if not made of clear sapphire material, is formed with an aperture of about the size of the photoactive area of the cells 46 and 48. The peripheral edges of the cells 46 and 48 are adhered to opposite surfaces of the heat spreader plate 44.

The upper surface of heat spreader plate 44 is metallized with islands 50 and 52 of conductive material (FIGS. 9 and 12) Island 50 extends under a metallization on the lower surface of the upper cell 46 and island 52 is connected to metallization on the upper surface of the upper cell 46 by ribbons 54.

Figures 8, 9, 10:
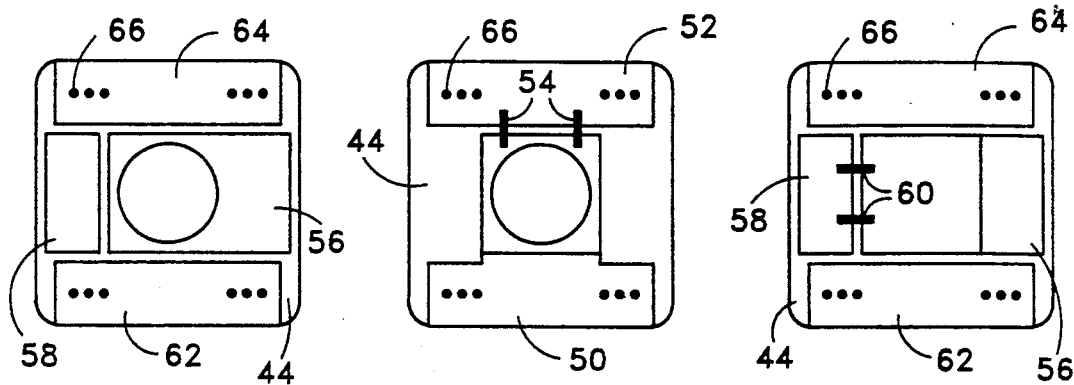
FIG. 8 is a plan view of the lower side of a heat spreader plate from the photocell shown in FIG. 7 with four metallization islands and without either cell being attached.
FIG. 9 is a plan view of an upper side of the heat spreader plate of FIG. 8 showing the connections between the upper cell and the two metallization islands on the upper plate side.
FIG. 10 is a plan view of the lower side of the heat spreader plate of FIGS. 7 through 9 showing the connections between the lower cell and two metallization islands.

The lower surface of heat spreader plate 44 is shown in FIG. 8 and contains metallization islands 56 and 58. Island 56 extends around the central aperture 45 of the heat spreader plate 44 to engage metallization on the upper surface of the lower cell 48. Island 58 is connected to metallization on the lower surface of the lower cell by ribbons 60 as illustrated in FIG. 10.

With continued reference to FIGS. 8 and 10 that show the lower surface of the heat spreader plate 44, metallization islands 62 and 64 are provided to underlie islands 50 and 52, respectively. One way of providing an electrical connection between islands 50 and 62 is by vias or throughholes in the heat spreader filled with a conductive material. In a similar manner, island 52 may be electrically connected to island 64 thereby making the current for the GaAs/GaSb tandem cell available at four islands or contact areas that lie in a common plane on one surface of the heat spreader plate 44.

Figure 11:
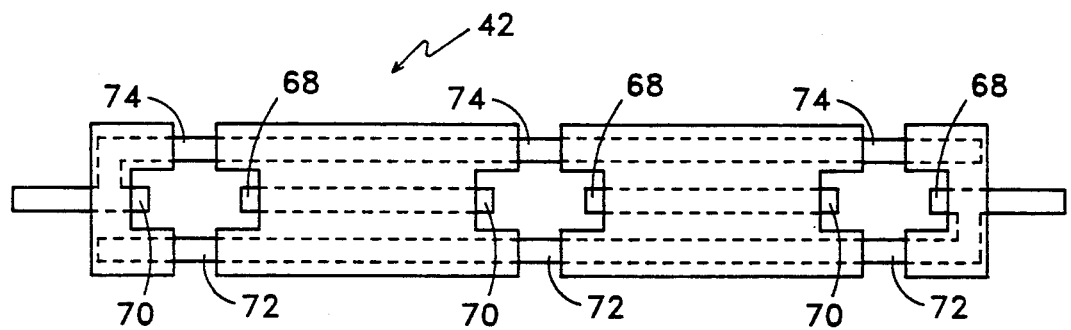
FIG. 11 is a plan view of the circuit carrier that is adapted to connect with the four metallization islands on the lower side of the heat spreader plate.

A circuit carrier 42 as illustrated in FIG. 11 engages only the four islands 56, 58, 62 and 64 with exposed conductive strip portions 68, 70, 72 and 74, respectively. The conductive strips may be punched from a copper foil and sandwiched between two layers of an insulating material that can withstand the space environment. One suitable material is a polyimide. The carrier material may be cut from a larger continuous sheet and preformed with apertures at the location of each cell, or formed in separate parts that are mounted on the remote face of the lower wall surface 16 of the panel 10.

The configuration of the conductive strips is selected to provide voltage and current matching which in the case of GaAs/GaSb units suggests the connection of three GaSb cells 48 in series to provide a voltage match for the GaAs cells 46 which are connected in parallel. By bonding the islands 56, 58, 62 and 64 on the lower surface of the heat spreader plate 44 as shown in FIG. 7 to the respective exposed conductive strip portions 68, 70, 72 and 74 shown in FIG. 11, a string of photocell units as shown in FIG. 12 may be provided for use with the panel shown in FIG. 2.

Figure 12:
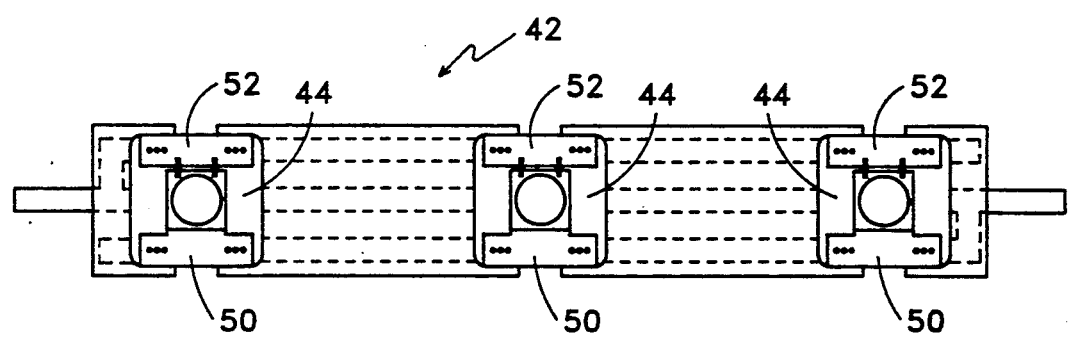
FIG. 12 is a plan view of three photocell units mounted on circuit carrier of FIG. 11.
Figure 13:
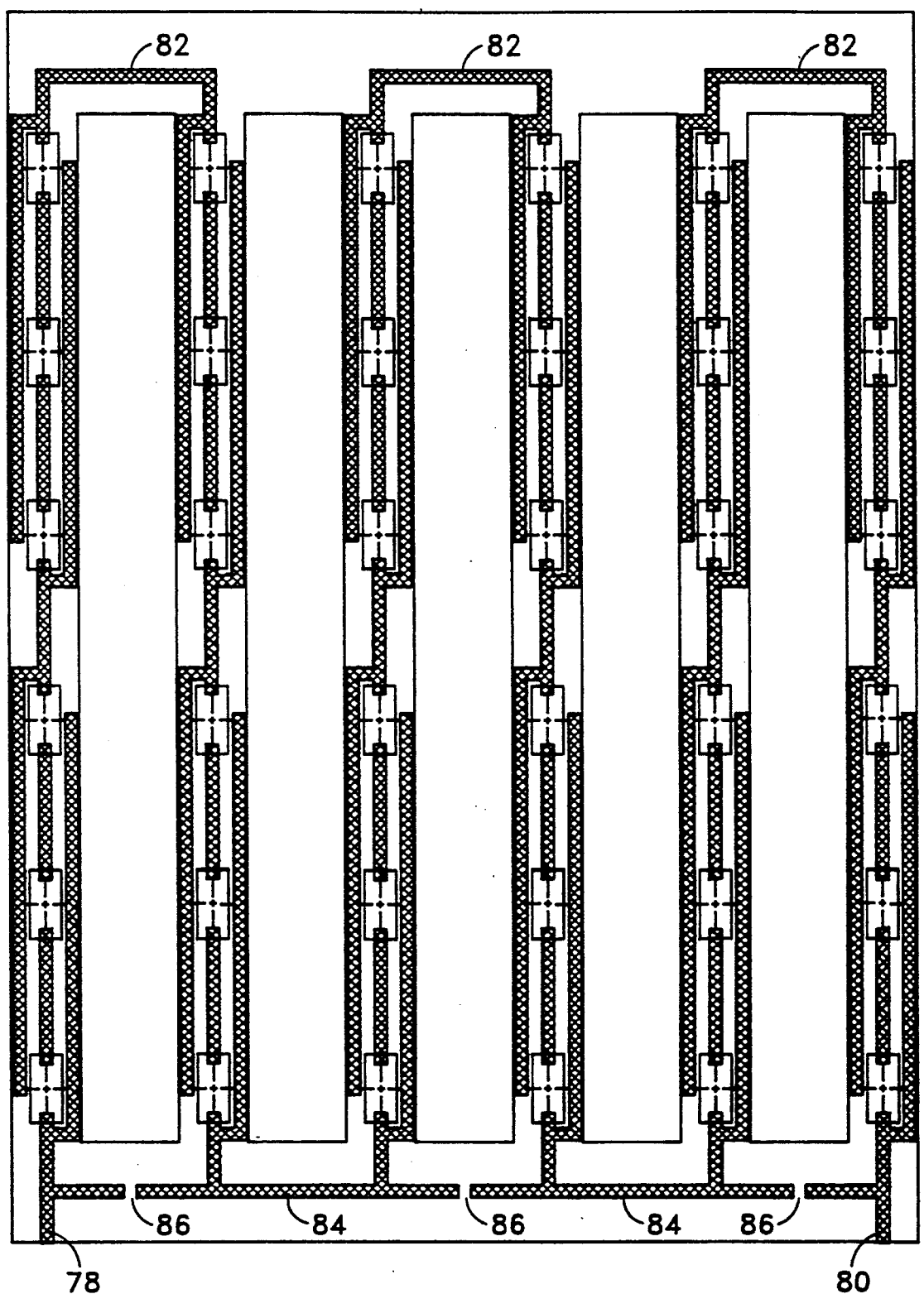
FIG. 13 is a view of one possible wiring pattern and the bottom side of the panel of FIG. 2 cell layout for a 6×6 module that is adapted for being adhered to the rear surface of the module of FIG. 2.

The strings of photocell units as shown in FIG. 12 may be connected in various circuit configurations including a patterned area as illustrated in FIG. 13. The strings of photocells shown in FIG. 13 are mounted or glued on the remote face of the lower wall surface 16 of the panel 10 so that the circuit carrier 42 is shielded from the concentrated solar energy which the lenses 13 focus at aperture 18. Then, the upper surface of the photocell unit 14 is mounted by a thermally conductive bond between the heat spreader plate 44 and the remote face of the lower wall surface 16 to capture the energy.

The configuration shown in FIG. 13 covers a 6×6 area and contains two terminals 78 and 80. In each row, two groups of three cell units each are shown connected in series. Adjacent rows are connected in series at the upper ends by conductors 82 and at their lower ends by conductors 84. Gaps 86 are provided in the line of lower conductors 84 to allow changes to be made to the interconnection circuitry. Four of the configurations shown in FIG. 13 are accommodated by the size of the panel illustrated in FIG. 2.

Various changes and alterations may be made without parting from the spirit of the invention disclosed herein. Certain aspects of the invention are applicable to solar cell arrays that are used both in terrestrial and space environments. All changes and modifications which fall within the scope of the claims, and equivalents thereof are intended to be embraced thereby.

We claim:

1. A panel for supporting a large group of energy collector lenses together with a corresponding number of solar cell units, comprising:

a unitary housing made from a unitary block of material having a continuous bottom wall and a plurality of recessed compartments that are defined by upstanding walls that are an integral part of said housing to provide a rigid structure having a low weight to area ratio;

a plurality of lenses mounted on the housing, one lens for each compartment;

said upstanding walls being sufficiently rigid to support the lenses at a fixed distance from the bottom wall;

said bottom wall having a central opening in each compartment aligned with a focal point of the corresponding lens to provide an index position for locating a solar cell unit at the focal point in each compartment.

2. The panel of claim 1 wherein said lenses are supported at the upper ends of said upstanding walls, and further comprising solar cell units mounted at the focal point in a respective compartment and the solar cells are electrically connected together by circuitry that is substantially shielded from focused solar energy.

3. The panel of claim 2 wherein the solar cell units are mounted on a side of said bottom wall that is remote from said upstanding walls and the solar cell units are electrically connected together by circuitry located on the bottom wall remote side to be shielded from focused solar energy.

4. A panel for supporting a large group of energy collector lenses together with a corresponding number of solar cell units, comprising:

a unitary housing having a continuous bottom wall and a plurality of recessed compartments that are defined by upstanding walls that are an integral part of said housing to provide a rigid structure having a low weight to area ratio;

a plurality of lenses mounted on the housing, one lens for each compartment;

said upstanding walls being sufficiently rigid to support the lenses at a fixed distance from the bottom wall;

said bottom wall having a central opening in each compartment aligned with a focal point of the corresponding lens to provide an index position for locating a solar cell unit at the focal point in each compartment;

a solar cell unit for each compartment mounted on a side of said bottom wall that is remote from said upstanding walls and including upper and lower cells of different semiconductive materials with the lower cell being mounted to receive radiation that has passed through the upper cell; and said solar cell units being electrically connected together by circuitry located on the bottom wall remote side to be shielded from focused solar energy, said circuitry comprising longitudinally extending strips of conductive material sandwiched between layers of an insulative material that is bonded to the bottom wall remote side and the conductive strips being arranged to provide voltage matching and power collection from the upper and lower cells mounted to said panel.

5. The panel of claim 4 wherein:

the upper and lower cells are bonded to opposite sides of a heat spreader body of thermally conductive electrically non-conductive conductive material having metallized islands thereon with current carrying surfaces of said cells connected to said metallized islands; and said heat spreader body is mounted in a thermally conducting relation with the bottom wall remote side of said housing and the conductive strips in said circuitry are bonded to said metallized islands.

6. The panel of claim 5 where the conductive strips in the circuitry are bonded to the metallized islands on only one side of said heat spreader body.

7. The panel of claim 5 wherein:

the metallized islands are on parallel faces that are on opposite sides of said heat spreader body;

one of said parallel faces has two islands of conductive material at diametrically opposite sides of said focal point in each compartment with the other of said parallel faces having four islands of conductive material with a first two of said islands being aligned with and electrically connected to the two islands of conductive material on said one face; and the other two of said four islands are diametrically disposed and positioned between the first two of said four islands to provide four terminals that are substantially coplanar.

8. A heat spreader body comprising a thermally conductive, electrically non-conductive material having parallel faces;

one of said faces having two islands of conductive material at diametrically opposite sides of a central area;

the other of said faces having four islands of conductive material with a first two of said four islands being aligned with and electrically connected to the two islands of conductive material on said one face; and the other two of said four islands being diametrically disposed and positioned between the first two of said four islands to provide four terminals that are substantially coplanar.

9. The heat spreader body of claim 8 wherein the electrical connection between the aligned islands includes vias extending through the spreader body with electrically conductive material filling said vias.

10. The body of claim 8 wherein the non-conductive material is AlN and said central area comprises an opening for alignment with photoactive areas of photocells mounted to the body.

11. A panel supporting a plurality of rows of solar cell units on a continuous bottom wall that has an aperture for each cell unit, said apertures being surrounded by side walls that are interconnected as a honeycomb, said side walls and said bottom wall being integrally formed from a unitary block of material, a plural number of solar radiation concentrators for focusing solar radiation at said bottom wall apertures, said concentrators being supported by the panel on a side of said bottom wall that is remote from said cell units.

12. A panel supporting a plurality of rows of tandem cell units on a continuous bottom wall that has an aperture for each cell unit;

a plural number of solar radiation concentrators for focusing solar radiation at said bottom wall apertures, said concentrators being supported by the panel on a side of said bottom wall that is remote from said tandem cell units;

said tandem cell units comprising:

upper and lower cells;

a heat spreader plate having opposed surfaces, said surfaces each having metallization islands that serve as terminals for said cells;

said upper and lower cells being mounted on opposite surfaces of said plate;

a circuit carrier having at least three parallel electric current carrying strips and spaced openings that are in registration with the tandem cell units in said row, said openings being sized to expose portions of the current carrying strips; and means for connecting said exposed strip portions to the metallization islands to provide voltage matching circuitry and means for collecting all of the electrical power generated by said tandem cell units.

13. A panel supporting a plurality of rows of tandem cell units on a continuous bottom wall that has an aperture for each cell unit;

a plural number of solar radiation concentrators for focusing solar radiation at said bottom wall apertures, said concentrators being supported by the panel on a side of said bottom wall that is remote from said tandem cell units;

said tandem cell units each comprising an upper cell of a first semiconductor material having upper and lower surfaces;

a lower cell of a second semiconductive material having upper and lower surfaces;

a heat spreader comprising a flat plate of thermally conductive, electrically non-conductive material sandwiched between the lower surface of the upper cell and the upper surface of the lower cell; and metallization on the heat spreader forming electrical circuitry for said unit, said metallization including a first island that engages a lower surface of the upper cell and a second island that is bridged by conductive material to the upper surface of the upper cell, a third island that engages the upper surface of the lower cell and a fourth island that is bridged by conductive material to the lower surface of the lower cell.

14. The panel of claim 13 further comprising a flexible circuit carrier having strips of conductive material carried by an insulating polymer material in the form of a tape, an aperture in said tape at which portions of said strips of conductive material are exposed, and means bonding said strip portions to selected islands of metallization on said heat spreader plate.

15. The panel of claim 14 wherein two of said strips of conductive material are separated by a distance which is greater than a corresponding dimension of said cell unit, the aperture size is greater than the corresponding size of said cell unit and the cell unit is positioned within said aperture and connected to the conductive strips in said circuit carrier solely through metallization on said heat spreader plate.

16. The panel of claim 13 wherein:
said metallization includes fifth and sixth islands which are positioned to be in alignment with the first and second islands on one side of the heat spreader; and
via means extend through the thickness of said heat spreader for electrically connecting together the first and fifth islands and the second and sixth islands respectively thereby forming a four terminal device.

17. The panel of claim 16 wherein the exposed strip portions of the tape are bonded only to the third, fourth, fifth and sixth islands that are on one side of said heat spreader.

18. A row of tandem cell units interconnected in the form of a string, comprising:
upper and lower cells mounted on opposite sides of a heat spreader having opposed surfaces each having metallization islands that serve as terminals for said cells;
a circuit carrier having electric current carrying strips and spaced openings that are in registration with tandem cell units in said row, said openings being sized to expose portions of the current carrying strips; and
means for bonding said exposed strip portions to the metallization islands to provide voltage matching circuitry and means for collecting all of the electrical power generated by said tandem cell units.

19. A tandem cell unit comprising:
an upper cell of GaAs having upper and lower surfaces;
a lower cell of GaSb having upper and lower surfaces;
a heat spreader sandwiched between the lower surface of the upper cell and the upper surface of the lower cell and having an aperture aligned with photoactive areas of said cells;
said heat spreader including metallization that forms electrical circuitry for said unit;
said metallization including a first island that engages the lower surface of the upper cell, a second island that is bridged by conductive material to the upper surface of the upper cell, a third island that engages the upper surface of the lower cell, and a fourth island that is bridged by conductive material to the lower surface of the lower cell.

20. The tandem cell unit of claim 19 further comprising a circuit carrier having strips of conductive material carried by an insulating polymer material in the form of a tape, an aperture in said tape at which portions of said strips of conductive material are exposed, and means bonding said strip portions to selected islands of metallization on said heat spreader plate.

21. The tandem cell unit of claim 20 wherein two strips of conductive material have parallel portions separated by a space which is greater than a corresponding dimensions of said cell unit, the aperture size is greater than the corresponding size of said cell unit and the cell unit is positioned within said aperture and connected to said circuit carrier solely through metallization on said heat spreader plate.

22. The tandem cell unit of claim 19 wherein:
the metallization includes fifth and sixth islands which are positioned to be in alignment with the first and second islands; and
via means extend through the heat spreader for electrically connecting together the first and fifth islands and the second and sixth islands respectively.

23. The tandem unit of claim 22 wherein the exposed strip portions of the tape are bonded only to the third, fourth, fifth and sixth islands that are on one side of said heat spreader.

24. The tandem unit of claim 19 wherein the heat spreader is AlN or sapphire.

25. A panel supporting a large number of solar energy collector lenses together with a corresponding number of tandem solar cell units, comprising:
a housing;
at least one lens supported on one side of said housing;
at least one tape circuit mounted on an opposite side of said housing;
at least one tandem solar cell unit secured to said housing for receiving solar energy collected by said lens; and
means for connecting current carrying surfaces of said at least one tandem solar cell unit to said tape circuit, including a heat spreader.

26. The panel of claim 25 wherein the tape circuit comprises electrical conductors connected to each of a plurality of cell units carried by said housing to provide voltage and current matching and collection of the electrical power generated by said cell units.

27. The panel of claim 26 wherein the heat spreader contains conductive islands on a surface facing said tape circuit and conductors in said tape circuit are bonded to said conductive islands.

28. The panel of claim 26 wherein the heat spreader contains two conductive islands on opposite surfaces for connection to respective current carrying surfaces of one photocell of a solar cell unit and serves as the sole means for electrical connection between said one photocell of said cell units and conductors in said tape circuit.

29. The panel of claim 25 wherein the heat spreader is mounted in a thermal transfer relationship to said housing and to said tandem cell unit.

30. The panel of claim 29 wherein the tandem cell unit comprises a pair of photocells that are mounted on opposite sides of said heat spreader with one photocell receiving radiant energy that has passed through the other of said pair of photocells.

31. The panel of claim 30 wherein the heat spreader contains conductive islands on a surface facing said tape circuit and conductors in said tape circuit are bonded to said conductive islands.

32. The panel of claim 30 wherein the heat spreader contains two conductive islands on opposite surfaces for connection to respective current carrying surfaces of said photocells and serves as the sole means for electrical connection between one of said cell units and conductors in said tape circuit.

33. The panel of claim 31 wherein the tape circuit comprises electrical conductors connected to each of a plurality of cell units carried by said housing to provide voltage and current matching and collection of the electrical power generated by said cell units.

34. A method of making a lightweight honeycomb panel for a solar cell module comprising:

providing a block of solid material having a thickness related to a focal length for a solar cell lens;

forming side-by-side compartments by machining each compartment to have a depth slightly less than the block thickness to form a bottom wall and side walls as thin as can be produced that have a rigidity sufficient to support solar cells lenses; and providing a central opening in each compartment bottom wall that is related to a position of a focal point for the lens that is associated with said compartment to serve as a position reference for a concentrated sunlight solar cell.

35. The method of claim 34 wherein the compartments in the block are in parallel rows, the solar cells are mounted at said focal points from a side of said block that is opposite to the side on which solar cell lenses are adapted to be mounted.

36. The method of claim 34 wherein the solar cells are a tandem GaAs cell and GaSb cell that form a cell unit and comprising the further steps of mounting the cells of a cell unit on opposite sides of a heat spreader plate;

connecting said plates by circuitry into the form of a string; and attaching said string to a back wall of the block on a side opposite the lenses with each cell unit being aligned with the focal point of an associated lens.

37. A method of fabricating a row of tandem solar cell units interconnected in the form of a string, said tandem cell units each comprising an upper cell and a lower cell of different semiconductive material with the lower cell being mounted to receive radiation that has passed through the upper cell and the upper and lower cells are mounted on opposite sides of a heat spreader body having metallized islands that serve as terminals for said cells, comprising:

providing a foil of an electrically conductive first material having a predetermined thickness;

punching the foil to form electric circuit carrying strips;

providing a coating of an electrically conducting material that is different from the first material on portions of said current carrying strips;

providing a pair of layers of heat resistant polymer dielectric material in the form of a tape, said tape having prepunched holes to provide spaced openings that are in registration with the row of solar cell units and sized to expose the coated portions of the current carrying strips;

applying the tape layers on opposite sides of the current carrying strips to form a laminate with the metal coated portions of the current carrying strips exposed in each opening; and connecting said metal coated portions to the metallized islands on said heat spreader body.

* * * * *